(12) United States Patent
Irisawa et al.

(10) Patent No.: US 9,421,646 B2
(45) Date of Patent: Aug. 23, 2016

(54) SOLDERING PASTE AND FLUX

(75) Inventors: Atsushi Irisawa, Tokyo (JP); Masashi Kashiwabara, Saitama (JP); Kenji Kondo, Nara (JP); Masahito Hidaka, Osaka (JP)

(73) Assignees: KOKI COMPANY LIMITED, Tokyo (JP); PANASONIC CORPORATION, Osaka (JP)

( * ) Notice: Subject to any disclaimer, the term of this patent is extended or adjusted under 35 U.S.C. 154(b) by 487 days.

(21) Appl. No.: 13/876,949

(22) PCT Filed: Mar. 9, 2011

(86) PCT No.: PCT/JP2011/055485
§ 371 (c)(1),
(2), (4) Date: Mar. 29, 2013

(87) PCT Pub. No.: WO2012/042926
PCT Pub. Date: Apr. 5, 2012

(65) Prior Publication Data
US 2013/0186519 A1 Jul. 25, 2013

(30) Foreign Application Priority Data
Sep. 29, 2010 (JP) ................................. 2010-218906

(51) Int. Cl.
*B23K 35/26* (2006.01)
*B23K 35/02* (2006.01)
(Continued)

(52) U.S. Cl.
CPC ............. *B23K 35/262* (2013.01); *B23K 35/025* (2013.01); *B23K 35/0244* (2013.01); *B23K 35/362* (2013.01); *B23K 35/3616* (2013.01);
(Continued)

(58) Field of Classification Search
CPC . B23K 35/3618; B23K 35/262; B23K 35/025

USPC ........................................................... 148/24
See application file for complete search history.

(56) References Cited

U.S. PATENT DOCUMENTS

2008/0115861 A1* 5/2008 Ishiga et al. ................... 148/23

FOREIGN PATENT DOCUMENTS

| CN | 1422723 A | 6/2003 |
| CN | 101437900 A | 5/2009 |

(Continued)

OTHER PUBLICATIONS

Translation of the International Preliminary Report on Patentability (PCT/ISA/237) (5 pages), (PCT/IB/373) (1 page) of International Application No. PCT/JP2011/055485 mailed Apr. 25, 2013 (Form PCT/IB/338) (1 page), (Form PCT/IB/326) (1 page).

(Continued)

*Primary Examiner* — Weiping Zhu
(74) *Attorney, Agent, or Firm* — Westerman, Hattori, Daniels & Adrian, LLP

(57) ABSTRACT

The object of the present invention is to provide a solder paste that enables to form a surface mounting structure for electronic components that exhibits crack resistance in a solder joint section even in 100 heat-shock cycles at −40° C. to 150° C. as required for use in the vicinity of engines for vehicular applications. A flux including an amine halogen salt and a dicarboxylic acid is kneaded with a Sn—Ag—Bi—In alloy powder. As a result, a solder paste exhibiting long continuous printability, little occurrence of solder balls, and excellent joining ability with no cracking in 100 heat-shock cycles at −40° C. to 150° C. is obtained.

10 Claims, 1 Drawing Sheet

(51) Int. Cl.
*C22C 13/00* (2006.01)
*B23K 35/36* (2006.01)
*B23K 35/362* (2006.01)
*C22C 1/04* (2006.01)

(52) U.S. Cl.
CPC .......... *B23K 35/3618* (2013.01); *C22C 1/0483* (2013.01); *C22C 13/00* (2013.01)

(56) References Cited

FOREIGN PATENT DOCUMENTS

| | | |
|---|---|---|
| JP | 03-216292 A | 9/1991 |
| JP | 05-318176 A | 12/1993 |
| JP | 06-063788 A | 3/1994 |
| JP | 08-206874 A | 8/1996 |
| JP | 10-249577 A | 9/1998 |
| JP | 2003-260589 A | 9/2003 |
| JP | 2004-202518 A | 7/2004 |
| JP | 2005-288490 A | 10/2005 |
| JP | 2006-055883 A | 3/2006 |
| JP | 2006-167802 A | 6/2006 |
| JP | 2006167802 A * | 6/2006 |
| JP | 2008-012576 A | 1/2008 |
| JP | 2008-072065 A | 3/2008 |

OTHER PUBLICATIONS

Japanese Office Action dated Nov. 28, 2014, issued in corresponding JP Application No. 2010-218906 with English translation (8 pages).
Office Action dated Jan. 4, 2015, issued in Chinese Application No. 201180046054.6, w/English translation. (21 pages).
International Search Report of PCT/JP2011/055485, Mailing Date of Jun. 7, 2011.
Witten Opinion of PCT/JP2011/055485, Mailing Date of Jun. 7, 2011.

* cited by examiner

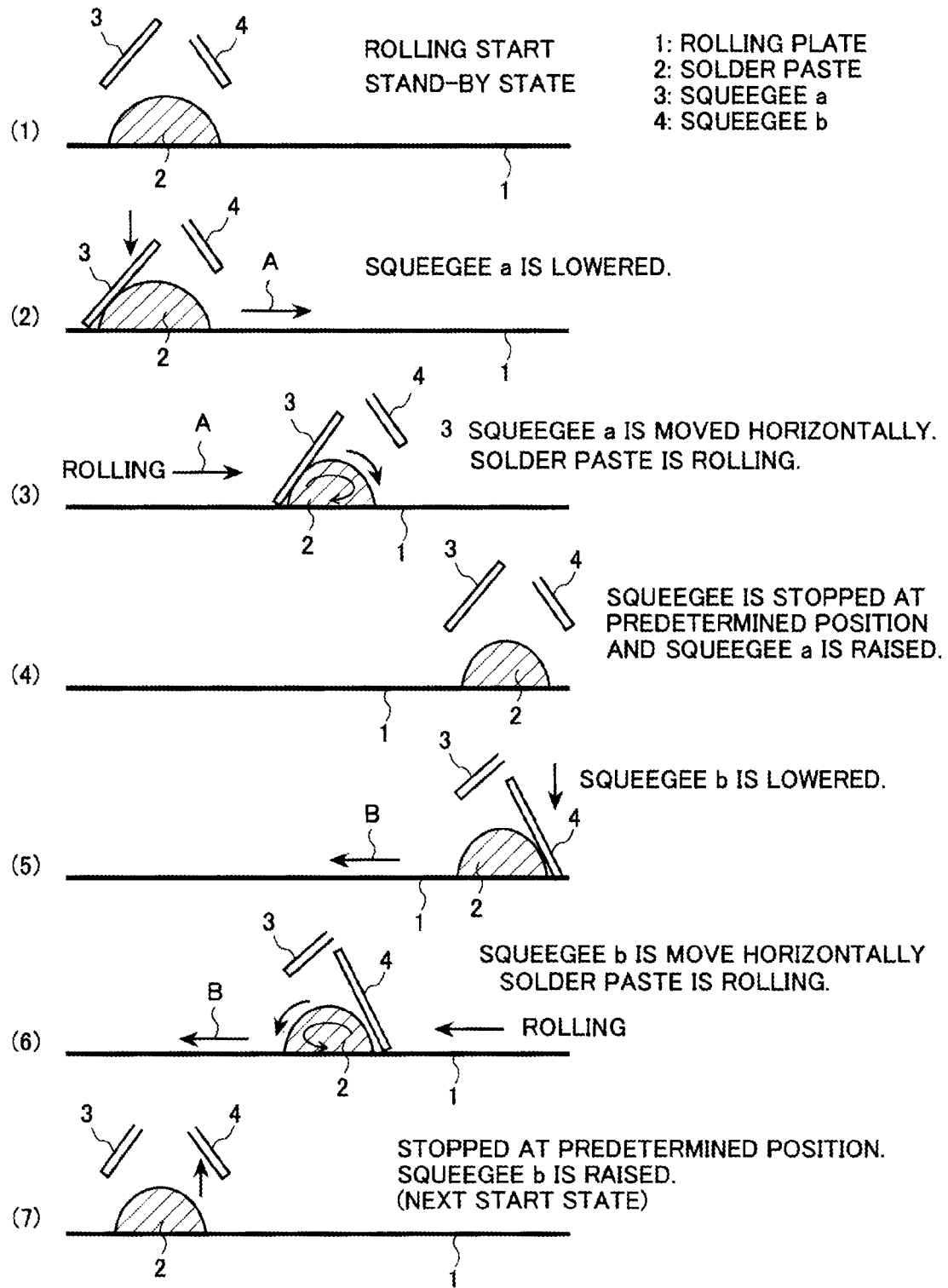

SOLDERING PASTE AND FLUX

TECHNICAL FIELD

The present invention relates to a solder paste constituted by a metal powder and a flux including an amine halogen salt and an organic acid.

BACKGROUND ART

The "solder paste" as referred to in the invention of the present application is a paste-like solder (typically also referred to as "solder cream" and "soldering paste") obtained by mixing (kneading) a solder alloy powder and a flux. Tin-lead systems have been conventionally used as solder alloys, but a transition to lead-free solders (containing no lead) has been made in recent years with consideration for hazardousness of lead.

Heat resistance of individual electronic components in substrate mounted structures of electronic components has recently increased. However, as the demand for valve control such as slot valve or air intake valve control has been growing following the increased in functionality of vehicles, it is required that no cracks occur in soldered portions of a mounting substrate even in a 1000-cycle heat-shock test of –40° C. to 150° C. that is required for components actually used around the engine room of a vehicle, that is, in the vicinity of an engine. It is also necessary that lead-free solder alloy materials be used to reduce environmental load, and solder pastes are also needed that enable reflow mounting with solder alloy materials having high heat resistance.

Thus, Sn—Ag—Bi—In solder alloy materials have been suggested as lead-free solder alloy materials that are not only suitable for applications requiring high heat resistance, but also have good mechanical properties and can be used for substrate mounting (see, for example, Patent Document 1).

Mounted structures of electronic components in which solder joint reliability is increased and heat resistance is also increased by using Sn—Cu or Sn—Ag solder alloy materials and expensive substrates from a metal core or a ceramic material with high heat radiation ability as substrate materials, thereby increasing heat resistance of substrate mounting, have been suggested (see, for example, Patent Document 2).

It has also been suggested to include a carboxylic-acid-including viscosity increase inhibitor that is compatible with resin components with a low dissociation constant into a flux (see, for example, Patent Document 3) and include a dicarboxylic acid that is a ring-opened solid body at normal temperature (see, for example, Patent Document 4) in a solder paste to improve substrate mounting ability.

PRIOR ART DOCUMENT

Patent Document

Patent Document 1: Japanese Patent Application Publication No. H8-206874
Patent Document 2: Japanese Patent Application Publication No. 2008-72065
Patent Document 3: Japanese Patent Application Publication No. H5-318176
Patent Document 4: Japanese Patent Application Publication No. H6-63788

DISCLOSURE OF THE INVENTION

Problem to be Solved by the Invention

However, the temperature level of high-temperature environment in which the solder material with improved mechanical properties, such as that of the invention disclosed in Patent Document 1, can be used is unclear. The 1000-cycle heat-shock test of –40° C. to 150° C. that is actually required for use in the vicinity of a vehicular engine revealed the conditions for a metal composition that prevent the occurrence of cracks when the dimensions of FR5 glass epoxy substrate and electronic components are controlled, but a solder paste that ensures reliability and makes it possible to print a solder alloy powder including easily oxidizable In has not been reported.

When a low-strength solder of a Sn—Ag system or a solder with poor wetting ability of a Sn—Cu system is used, as in the invention disclosed in Patent Document 2, stresses acting upon the solder cannot be relaxed and the occurrence of solder cracks is difficult to prevent in a 1000-cycle heat-shock test of –40° C. to 150° C. Further, the cost is very high when a metal core or a ceramic material with high heat radiation ability is used as a substrate material.

With the method described in Patent Document 3, a constant viscosity stabilization effect is demonstrated with respect to a typical solder alloy, but a large number of powerful activators should be used to improve wetting ability in a solder including easily oxidizable In. Therefore, stability of viscosity cannot be sufficiently ensured when the solder is used together with such powerful activators.

Further, when a dicarboxylic acid having a large carbon number is used, as in the method described in Patent Document 4, the additive amount thereof should be increased to obtain stable printability with solders using in, the paste is difficult to adjust to a viscosity suitable for printing, and the paste has poor utility.

It is an object of the present invention to resolve the above-described problems and provide a solder paste suitable for providing an electronic component mounting mechanism which enables reflow mounting and solder connection capable of withstanding 1000 heat-shock cycles of –40° C. to 150° C. by mixing a Sn—Ag—Bi—In heat-resistant solder alloy powder material with a flux in accordance with the present invention to obtain a solder paste.

Means to Solve the Problem

A flux of the invention of the present application that serves to attain the abovementioned object is a flux that is mixed with a Sn—Ag—Bi—In alloy powder to constitute a solder paste, the flux including:

(1) an amine halogen salt at 0.1 wt % to 4.0 wt % and malonic acid at 0.2 wt % to 5.0 wt %.

Further, (2) oxalic acid may be used at 0.2 wt % to 5.0 wt % in place of the malonic acid at 0.2 wt % to 5.0 wt %.

Furthermore, (3) maleic acid may be used at 0.2 wt % to 5.0 wt % in place of the malonic acid at 0.2 wt % to 5.0 wt %.

Also, (4) fumaric acid may be used at 0.2 wt % to 5.0 wt % in place of the malonic acid at 0.2 wt % to 5.0 wt %.

Also, (5) citraconic acid may be used at 0.2 wt % to 5.0 wt % in place of the malonic acid at 0.2 wt % to 5.0 wt %.

Furthermore, (6) itaconic acid may be used at 0.2 wt % to 5.0 wt %; in place of the malonic acid at 0.2 wt % to 5.0 wt %.

Furthermore, (7) a diphenyl guanidine hydrohalic acid salt at 0.1 wt % to 2.5 wt % may be used as the amine halogen salt at 0.1 wt % to 4.0 wt %; and (8) additionally may be used a rosin at 30 wt % to 50 wt %, hexyl carbitol at 20.0 wt % to 40.0 wt %, and a bisamide thixotropic agent at 3 wt % to 10 wt %.

Further, a solder paste of the invention of the present application that serves to attain the abovementioned object is a solder paste prepared by kneading a Sn—Ag—Bi—In alloy powder and a flux, wherein (9) the Sn—Ag—Bi—In alloy powder has an Ag content of 0.1 wt % to 5 wt %, a Bi content of 0.1 wt % to 5 wt %, and an In content of 3 wt % to 9 wt %, with a balance being Sn and unavoidable components; and

(10) components of the flux include an amine halogen salt and a dicarboxylic acid.

In this case,

(11) the flux components may include a dicarboxylic acid having an unsaturated double bond in a molecular structure.

Also,

(12) the flux components may include a dicarboxylic acid having 2 or 3 carbon number in a molecular structure.

Effect of the Invention

According to the invention set forth in claim 1, it is possible to provide a solder paste for surface mounding by reflow of a solder alloy with an environmentally friendly lead-free composition, a melting point equal to or lower than 220° C., a high mechanical strength, and high heat shock resistance.

According to the invention set forth in claim 2, in the solder paste described in claim 1, the reaction of the flux and the solder powder including easily oxidizable in at normal temperature is suppressed and the increase in viscosity is inhibited. Not only the stability of viscosity during solder paste storage is ensured, but also the increase in viscosity can be inhibited during printing in which the paste is exposed for a long time to normal temperature, and stable printing can be performed.

According to the invention set forth in claim 3, in the solder paste described in claim 1, the reaction of the flux and the solder powder including easily oxidizable in at normal temperature can be suppressed and stable printing can be performed even in long-term printing in which the paste is subjected to continuous shearing.

BRIEF DESCRIPTION OF THE DRAWINGS

FIG. 1 is a schematic diagram illustrating the operation of the evaluation device.

MODE FOR CARRYING OUT THE INVENTION

The configuration of flux used in accordance with the present invention is explained below.

A specific feature of the flux according to the invention of the present application with respect to a typical flux prepared by mixing a rosin, a solvent, a plasticizer, an activator, an additive, and a sagging preventing agent is that an amine halogen salt and a dicarboxylic acid are used as the activator constituting the flux according to the invention of the present application.

Examples of the amine in the amine halogen salt include diethylamine, dibutylamine, tributylamine, diphenylguanidine, and cyclohexylamine.

Examples of the corresponding halogens include fluorine, chlorine, bromine, iodine, and astatine, but fluorine is undesirable since it is strongly corrosive and degrades reliability. Further, astatine is classified as a halogen, but utility thereof is low, since the half-life period thereof is extremely short and it is present only in nuclear reactors.

Examples of dicarboxylic acids that can be used at the same time include maleic acid, fumaric acid, malonic acid, malic acid, succinic acid, and glutalic acid.

EXAMPLE 1

Examples are described below.

Solder pastes are obtained by mixing a Sn—Ag—Bi—In alloy powder (particle size 20 to 38 μm) with fluxes compounded as shown in Table 1 (numerical values for each composition represent wt %) to obtain a flux content ratio of 12.0 wt %. Soldering evaluation is performed by using such solder pastes. The pastes are also stored for 3 days in a thermostat bath at 40° C. and viscosity values before and after the storage are measured.

Evaluation results relating to the properties of the above-described solder pastes are presented below.

As for soldering evaluation, wetting ability with respect to a copper plate and solder cohesion ability were evaluated as solder melting ability by evaluation methods stipulated by JIS Z 3197 (Test Methods for Soldering Fluxes) and JIS Z 3284 (Solder Pastes).

Printing stability was evaluated by performing continuous squeezing shear evaluation and comparing the viscosity values after 4 h and 24 h with that before the evaluation. The evaluation method (rolling test) is explained with reference to FIG. 1.

FIG. 1 is a schematic diagram illustrating the operation of the evaluation device.

In the rolling test shown in FIG. 1, a single lump of a semispherical solder paste (soldering paste) is placed on a plate-shaped rolling plate, the solder paste is rolled in the direction of arrow A and continuously in the direction of arrow B by plate shaped objects called squeegees 3, 4, thereby bringing the solder paste into contact with oxygen and moisture contained in the atmosphere, and the dynamic stability of the solder paste is determined from the variations in viscosity and thixotropic ability (ability to change viscosity according to a agitation rate) under a mechanical load.

The viscosity was measured by using a spiral viscometer at a temperature of 25° C. and a revolution speed of 10 rpm by the evaluation method stipulated by JIS Z 3284 (Solder Pastes).

The results obtained in the above-described evaluation methods are presented in Tales 1 and 2.

TABLE 1

|  | Examples |  |  |  |  |  | Comparative examples |  |  |  |  |  |  |  |
|---|---|---|---|---|---|---|---|---|---|---|---|---|---|---|
| No. | 1 | 2 | 3 | 4 | 5 | 6 | 1 | 2 | 3 | 4 | 5 | 6 | 7 | 8 |
| Polymerized rosin (wt %) | 30-50 | 50 | 50 | 50 | 50 | 50 | 50 | 50 | 50 | 50 | 50 | 50 | 50 | 50 |

TABLE 1-continued

|  | Examples | | | | | | Comparative examples | | | | | | | |
|---|---|---|---|---|---|---|---|---|---|---|---|---|---|---|
| No. | 1 | 2 | 3 | 4 | 5 | 6 | 1 | 2 | 3 | 4 | 5 | 6 | 7 | 8 |
| Hexyl carbitol (wt %) | 20-40 | 39.8-35.0 | 39.8-35.0 | 39.8-35.0 | 39.8-35.0 | 39.8-35.0 | 42 | 38 | 38 | 38 | 40 | 38 | 38 | 38 |
| Diphenylguianidine hydrohalic acid salt (wt %) | 0.1-2.5 | 2 | 2 | 2 | 2 | 2 |  | 2 | 2 | 2 |  | 2 | 2 | 2 |
| Bis-amide thixotropic agent (wt %) | 3-10 | 8 | 8 | 8 | 8 | 8 | 8 | 8 | 8 | 8 | 8 | 8 | 8 | 8 |
| Malonic acid (wt %) | 0.2-5.0 |  |  |  |  |  |  |  |  |  |  |  |  |  |
| Oxalic acid (wt %) |  | 0.2-5.0 |  |  |  |  |  |  |  |  |  |  |  |  |
| Maleic acid (wt %) |  |  | 0.2-5.0 |  |  |  |  |  |  |  |  |  |  |  |
| Fumaric acid (wt %) |  |  |  | 0.2-5.0 |  |  |  |  |  |  |  |  |  |  |
| Citraconic acid (wt %) |  |  |  |  | 0.2-5.0 |  |  |  |  |  |  |  |  |  |
| Itaconic acid (wt %) |  |  |  |  |  | 0.2-5.0 |  |  |  |  |  |  |  |  |
| Succinic acid (wt %) |  |  |  |  |  |  |  |  | 2 |  |  |  |  |  |
| Glutalic acid (wt %) |  |  |  |  |  |  |  |  |  | 2 |  |  |  |  |
| Adipic acid (wt %) |  |  |  |  |  |  |  |  |  |  | 2 | 2 |  |  |
| Azelaic acid (wt %) |  |  |  |  |  |  |  |  |  |  |  |  | 2 |  |
| Sebacic acid (wt %) |  |  |  |  |  |  |  |  |  |  |  |  |  | 2 |

TABLE 2

|  |  | Examples | | | | | | Comparative Examples | | | | | | | |
|---|---|---|---|---|---|---|---|---|---|---|---|---|---|---|---|
| No. |  | 1 | 2 | 3 | 4 | 5 | 6 | 1 | 2 | 3 | 4 | 5 | 6 | 7 | 8 |
| Org. acid | Name | Malonic acid | Oxalic acid | Maleic acid | Fumaric acid | Citraconic acid | Itaconic acid | None | None | Succinic acid | Glutalic acid | Adipic acid | Adipic acid | Azelaic acid | Sebacic acid |
|  | Carbon number | 3 | 2 | 4 | 4 | 5 | 5 | — | — | 4 | 5 | 6 | 6 | 7 | 8 |
|  | Unsatisfied bond | No | No | Yes | Yes | Yes | Yes | No | No | No | No | No | No | No | No |
| Halogen |  | Yes | Yes | Yes | Yes | Yes | Yes | No | Yes | Yes | Yes | Yes | Yes | Yes | Yes |
| Printing stability |  | ○ | ○ | Δ | Δ | Δ | Δ | ○ | ○ | x | ○ | ○ | ○ | ○ | ○ |
| Shelf life |  | ○ | ○ | ○ | ○ | ○ | ○ | ○ | x | x | x | ○ | x | x | x |
| Wetting ability |  | ○ | ○ | ○ | ○ | ○ | ○ | x | ○ | ○ | ○ | x | ○ | ○ | ○ |
| Cohesion ability |  | ○ | Δ | ○ | ○ | ○ | ○ | x | ○ | ○ | ○ | x | ○ | ○ | ○ |

The determination criteria for the evaluation methods in Table 2 above are explained below.

1. Printing Stability

Symbols ○, Δ, and x denote the cases in which variation in viscosity is within 10%, within 15%, and above 15%, respectively.

2. Shelf Life

Symbols ○, Δ, and x denote the cases in which variation in viscosity is within 10%, within 20%, and above 20%, respectively.

3. Wetting Ability

A symbol ○ denotes categories 1 and 2, Δ denotes a category 3, and x denotes a category 4 in the dewetting test stipulated by JIS Z 3284 (Solder Pastes).

4. Cohesion Ability

A symbol ○ denotes categories 1 and 2, Δ denotes a category 3, and x denotes a category 4 in the solder ball test stipulated by JIS Z 3284 (Solder Pastes).

Malonic acid with 3 carbon number (Example 1) and oxalic acid with 2 carbon number (Example 2) were mixed with an amine halogen salt effective with respect to soldering ability of an indium-containing solder alloy. As a result, viscosity stability can be improved, while maintaining good soldering performance demonstrated due to the amine halogen salt. In Example 1, when the content ratio of malonic acid was 0.2 wt %, hexyl carbitol was used at 39.8 wt %, and when the content ratio of malonic acid was 5.0 wt %, hexyl carbitol was used at 35.0 wt % for a total of all of the component of 100 wt % at all times. The same is true for other examples.

In Examples 3 to 6, an amine halogen salt was mixed with an organic acid having an unsaturated double bond between carbon. Such compositions are excellent in terms of shelf life during storage, while maintaining soldering ability. Printing stability is somewhat lower than in Examples 2 and 3, but is still at a level causing no problems in practical use.

By contrast, in Comparative Example 1, neither an amine halogen salt nor an organic acid are added as activators. Since no reaction is induced, both the printing stability and shelf life are good, but since no activator contributing to soldering ability is present, the solder wetting ability and solder cohesion ability are extremely poor.

In Comparative Example 2, an amine halogen salt is added, but an organic acid is not added. The solder wetting ability and cohesion ability are improved with respect to those of Comparative Example 1, but since the halogen-containing activator reacts with the solder powder, the shelf life is degraded.

In Comparative Examples 3, 4, 6, 7, and 8, straight-chain succinic acid, glutalic acid, adipic acid, azelaic acid, and sebacic acid having 4 or more carbon number are added to the composition of Comparative Example 2. All of the organic acids having 4 or more carbon number improve soldering ability, but greatly degrade the stability of viscosity.

In Comparative Example 5, no amine halogen salt is added, and adipic acid, which is a straight-chain organic acid, is added. In this case, the stability of viscosity is good, but since an amine halogen salt, which is particularly effective in terms of soldering ability of indium-containing solders, is not included, soldering ability is poor.

The results described above indicate that by using a solder paste prepared by mixing a Sn—Ag—Bi—In alloy powder with a flux including an amine halogen salt and an organic acid having 2 to 3 carbon number or an organic acid having an unsaturated double bond, it is possible to provide a solder paste that has high heat shock resistance, combines good soldering ability with stability of viscosity, and is suitable for use under severe environment such as that in vehicular applications.

The organic acids used in the above-described embodiments are all used in amounts within a range of 0.2% to 5.0%, but a sufficient effect can be also obtained when the content ratio of the organic acid is equal to or greater than 0.5%. With a large amount, an effect is produced on stability of viscosity, but if the amount of the organic acid is too high, corrosion resistance is degraded.

The constituent components of the flux include a rosin, a solvent, a thixotropic agent (sagging preventing agent), an activator, and an additive. The rosin can be a natural rosin or a synthetic rosin such as polymerized rosin, disproportionated rosin, and hydrogenated rosin. Any of such rosins or a combination of a plurality thereof may be used. The solvent used in the flux is typically an alcohol of the so-called carbitol system or glycol system. Any of such alcohols or a combination of a plurality thereof may be used. An amide or caster wax can be used as the thixotropic agent. Other organic acids serving as activators may be used together with activators such as amine salts as the activator. Residue modifiers such as typical plasticizers and fillers may be used in combination as the additive.

INDUSTRIAL APPLICABILITY

A surface mounted structure of an electronic component in which no cracks occur in a soldered joint portion can be realized even in 1000 heat-shock cycles of −40° C. to 150° C. that are required for use in the vicinity of a vehicular engine.

EXPLANATION OF REFERENCE NUMERALS 1 rolling plate
2 solder paste
3 squeegee a
4 squeegee b

The invention claimed is:

1. A solder paste prepared by kneading a Sn—Ag—Bi—In alloy powder and a flux, wherein
   the Sn—Ag—Bi—In alloy powder has an Ag content of 0.1 wt % to 5 wt %, a Bi content of 0.1 wt % to 5 wt %, and an In content of 3 wt % to 9 wt %, with a balance being Sn and unavoidable components; and
   components of the flux include an amine halogen salt and a dicarboxylic acid, wherein the dicarboxylic acid has an unsaturated double bond between carbons in a molecular frame or 2 or 3 carbon number in a molecular frame.

2. A flux that is mixed with a Sn—Ag—Bi—In alloy powder to constitute a solder paste,
   this flux including an amine halogen salt at 0.1 wt % to 4.0 wt % and dicarboxylic acid at 0.2 wt % to 5.0 wt %,
   wherein the dicarboxylic acid has an unsaturated double bond between carbons in a molecular frame.

3. The flux according to claim 2, wherein the dicarboxylic acid is maleic acid.

4. The flux according to claim 2, wherein the dicarboxylic acid is fumaric acid.

5. The flux according to claim 2, wherein the dicarboxylic acid is citraconic acid.

6. The flux according to claim 2, wherein the dicarboxylic acid is itaconic acid.

7. A flux that is mixed with a Sn—Ag—Bi—In alloy powder to constitute a soldering paste,
   this flux including an amine halogen salt at 0.1 wt % to 4.0 wt % and dicarboxylic acid at 0.2 wt % to 5.0 wt %,
   wherein the dicarboxylic acid has 2 or 3 carbon number in a molecular frame.

8. The flux according to claim 7, wherein the dicarboxylic acid is malonic acid.

9. The flux according to claim 7, wherein the dicarboxylic acid is oxalic acid.

10. The flux according to any one of claims 2, 3 to 6, and 7 to 9, wherein a diphenyl guanidine hydrohalic acid salt at 0.1 wt % to 2.5% is used as the amine halogen salt at 0.1 wt % to 4.0 wt %, and additionally used are a rosin at 30 wt % to 50 wt %, hexyl carbitol at 20.0 wt % to 40.0 wt %, and a bisamide thixotropic agent at 3 wt % to 10 wt %.

* * * * *